(12) United States Patent
Hayes et al.

(10) Patent No.: US 6,864,189 B2
(45) Date of Patent: Mar. 8, 2005

(54) METHODOLOGY FOR MEASURING AND CONTROLLING FILM THICKNESS PROFILES

(75) Inventors: Timothy S. Hayes, Milton, VT (US); Michael C. Triplett, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,148

(22) Filed: Jun. 27, 2003

(65) Prior Publication Data

US 2004/0266035 A1 Dec. 30, 2004

(51) Int. Cl.⁷ .............................................. H01L 21/66
(52) U.S. Cl. ........................................ 438/758; 438/14
(58) Field of Search ................................... 438/758, 14

(56) References Cited

U.S. PATENT DOCUMENTS

| | | | |
|---|---|---|---|
| 5,300,313 A | * | 4/1994 | Anthony et al. ............... 427/9 |
| 5,375,064 A | | 12/1994 | Bollinger |
| 5,628,869 A | | 5/1997 | Malloon |
| 6,030,887 A | | 2/2000 | Desai et al. |
| 6,211,094 B1 | | 4/2001 | Jun et al. |

FOREIGN PATENT DOCUMENTS

| | | |
|---|---|---|
| JP | 60-4223 | 1/1985 |
| JP | 2-186621 | 7/1990 |
| JP | 2001-60572 | 1/2001 |

* cited by examiner

Primary Examiner—Luan Thai
(74) Attorney, Agent, or Firm—McGinn & Ginn, PLLC; William D. Sabo, Esq.

(57) ABSTRACT

A method evaluating an integrated circuit manufacturing process first establishes a "desired" profile of a given film in a prescribed manufacturing process by first recording multiple thickness measures taken at regular intervals along a number of lines crossing a plurality of different sample production runs of the same film formed in the integrated circuit manufacturing process. Next, the invention plots the thickness measures to produce sample film profiles of the film. These sample film profiles are averaged in a statistical process to produce the desired film profile. The desired film profile is compared to an actual production run. If the actual film profile does not match the desired film profile, the integrated circuit manufacturing process used to make the actual film profile can then be adjusted to make the actual film profile match the desired film profile more closely.

19 Claims, 6 Drawing Sheets

METHODOLOGY FOR MEASURING AND CONTROLLING FILM THICKNESS PROFILES

BACKGROUND OF INVENTION

1. Field of the Invention

The present invention generally relates to semiconductor manufacturing and more particularly to an improved system and methodology for controlling film thicknesses.

2. Description of the Related Art

Conventional semiconductor fabrication process control is based on normal statistical distribution methodologies. Conventional logic considers that all variation in process is random; wafer-to-wafer, run-to-run, and within wafer variations. However, conventional processes regularly produce a thickness pattern which introduces intrinsic variability to the measured average film thickness. The invention described below improves upon the conventional methodology of controlling film thickness variations.

SUMMARY OF INVENTION

The following disclosure presents an improved method of evaluating an integrated circuit manufacturing process. More specifically, the invention first establishes a "desired" profile of a given film in a prescribed manufacturing process by first establishing a reference film profile for the film. The reference profile can be established by at least three methods: 1) by recording multiple thickness measures taken at regular intervals along a number of lines crossing a plurality of different sample production runs of the same film formed in the integrated circuit manufacturing process, 2) by recording multiple thickness measures taken at regular intervals along a number of lines crossing a plurality of different actual production runs of the same film formed in the integrated circuit manufacturing process, 3) by arbitrarily defining multiple thickness measures at regular intervals along a defined number of lines. Next, the invention plots the thickness measures to produce sample film profiles of the film. These sample film profiles are averaged for methods 1 and 2 above in a statistical process to produce the desired film profile. For method 3 above, the profile is defined.

After establishing the "desired" film profile, the desired film profile is compared to an actual production run. To perform this comparison, the invention first plots multiple thickness measures taken at regular intervals along at least one line crossing the actual production film formed in the integrated circuit manufacturing process. This produces an actual film profile of the film which is then compared to the desired film profile. If the actual film profile does not match the desired film profile, the integrated circuit manufacturing process used to make the actual film profile can then be adjusted to make the actual film profile match the desired film profile more closely. The desired film profile can be a range of acceptable film profiles.

BRIEF DESCRIPTION OF DRAWINGS

The invention will be better understood from the following detailed description of preferred embodiments, in which.

DETAILED DESCRIPTION

The invention improves the control of film thicknesses within semiconductor manufacturing processes by evaluating an entire profile of a film layer (as opposed to an individual point, or the average of many points, within the film layer). Therefore, the invention does more than just evaluate whether the average thickness of a film layer is within an acceptable range. To the contrary, the invention evaluates whether the entire "profile" (e.g., cross-section) of the film layer is within an acceptable thickness profile range. By evaluating the profiles of the films, the invention more accurately evaluates the quality of the film layer in question, as well as the true variability of the film processing equipment and or film measurement equipment. This in turn allows the film formation processing to be refined more precisely, thereby reducing defects substantially and increasing yield.

Figure 1:
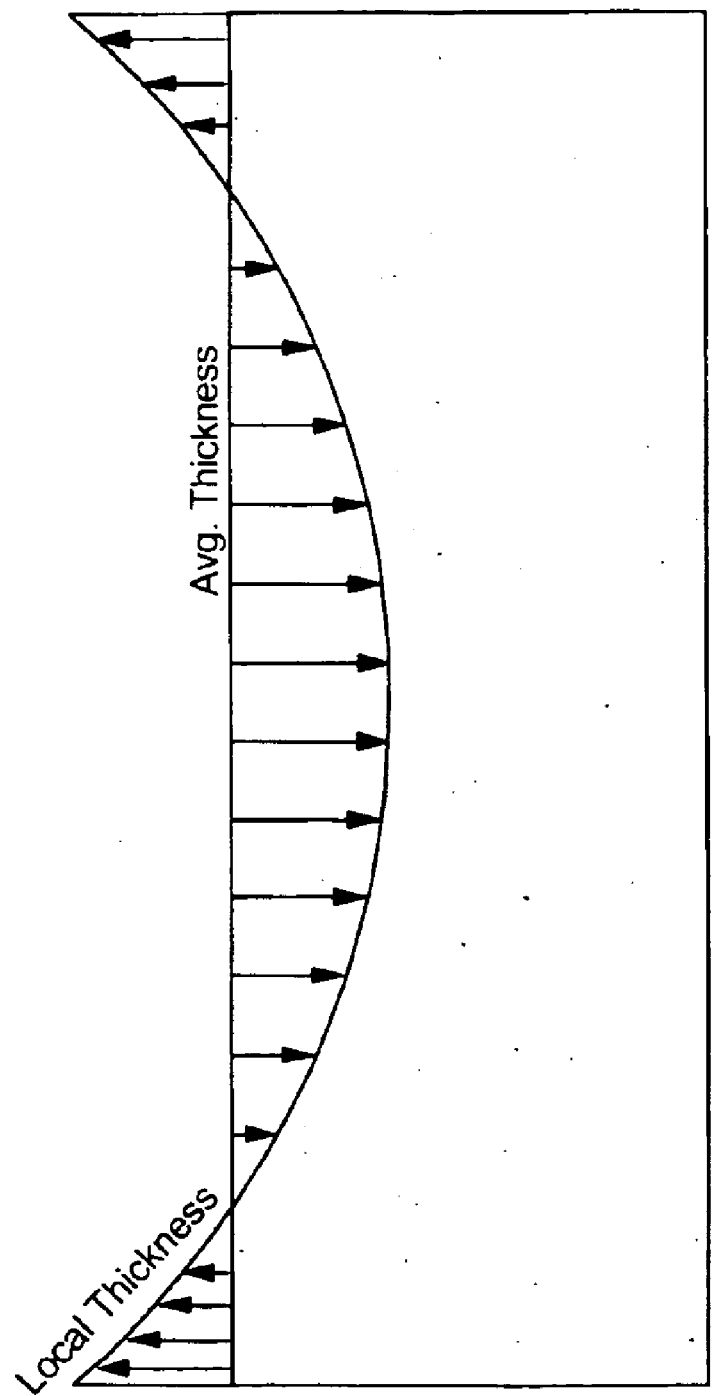
FIG. 1 is a schematic diagram showing the inherent non-uniformity of integrated circuits films.

An example of a sequence of semiconductor fabrication processing follows. Step one of the process is the film deposition (polysilicon growth). Step two of the process is lithographic patterning (gate conductor mask). Finally, step three of the process is film etching (polysilicon etch). The process equipment for each step has some "natural" behavior that results in a particular process pattern. For instance, film deposition (depending on the exact equipment) may vary in thickness from center to edge. In an LPCVD (low pressure chemical vapor deposition) polysilicon reactor the film thickness is a radial symmetric profile described by a simple polynomial (thin in the middle, thick on the edges). This is shown in FIG. 1, where the local thicknesses at the edges are above the average thickness, while the local thickness at the center is below the average thickness. However, design specifications are for a uniform film across the wafer with a target thickness and some allowed deviation. When controlling the LPCVD process as long as the specified average thickness and allowed standard deviation are met, then the process is conventionally said to be in "control'.

Some etch processes have an etch rate that is faster on the edges of the wafer and slower in the center. This radial dependence etch rate produces a subsequent film thickness with a radial symmetric profile described by a simple polynomial (thick in the middle, thin on the edge). The profile is essentially flipped from that of the LPCVD reactor. Like the LPCVD reactor, the etch tool is controlled by some target post etch thickness and some allowed deviation.

As mentioned previously, conventional process control schemes are not sensitive to the desired film thickness profile. To the contrary, conventional film thickness control methodologies merely measure one or more individual locations of the film. Because the film is not always flat, the conventional measurement process will contain inconsistencies that are simply based upon the natural profile of the film. Therefore, the conventional film thickness control process could indicate that two drastically different films have the same thicknesses and variability because mathematically the measurements produce the same statistical answer; however, the actual film thickness profiles are different. For example, convex and concave films could give the same average thickness and variability but physically are very different.

As another example, the etching process (which etches edges faster than it etches the central portion) will compensate somewhat for the deposition process (which deposits less material in the central portion). However, if the deposition process actually produces a substantially flat film, the edges of the film will be made excessively thin by the etching process. This situation is especially frustrating for conventional systems because the substantially flat film will actually be rated very highly because it would report an excellent standard deviation (a very low deviation of height throughout different locations of the film). Therefore, contrary to the anticipated high yield result that would be conventionally expected when using a low standard deviation film, the low standard deviation film would actually produce a lower yield because of the excessive thinning of the edges by the etching process. This demonstrates why the conventional film thickness control methodologies are less precise and produce lower yields than the inventive methodology.

To overcome the problems incurred with conventional film thickness measurements, the invention uses a "target" profile as a baseline for all metrology. This target ("normal") or "desired" film thickness profile is characterized and defined. The definition can be done mathematically or empirically. Mathematically, the profile is defined by fitting the local thickness (as measured or defined) with respect to the within wafer coordinate system (xy plane space). The mathematical description can be a 3-dimensional formula;

$$\text{Thickness} = f(x,y) \quad \text{eq. 1}$$

or, a collection of 2-dimensional formulas;

$$\text{Thickness}(x) = f(x) \quad \text{eq. 2}$$

Cross-sectional profile along x-axis $$\text{Thickness}(y) = f(y) \quad \text{eq. 3}$$

Cross-sectional profile along y-axis $$\text{Thickness}(x=y) = f(x=y) \quad \text{eq. 4}$$

Cross-sectional profile along (x=y)-axis

Ad-infinitum.

Figure 2:
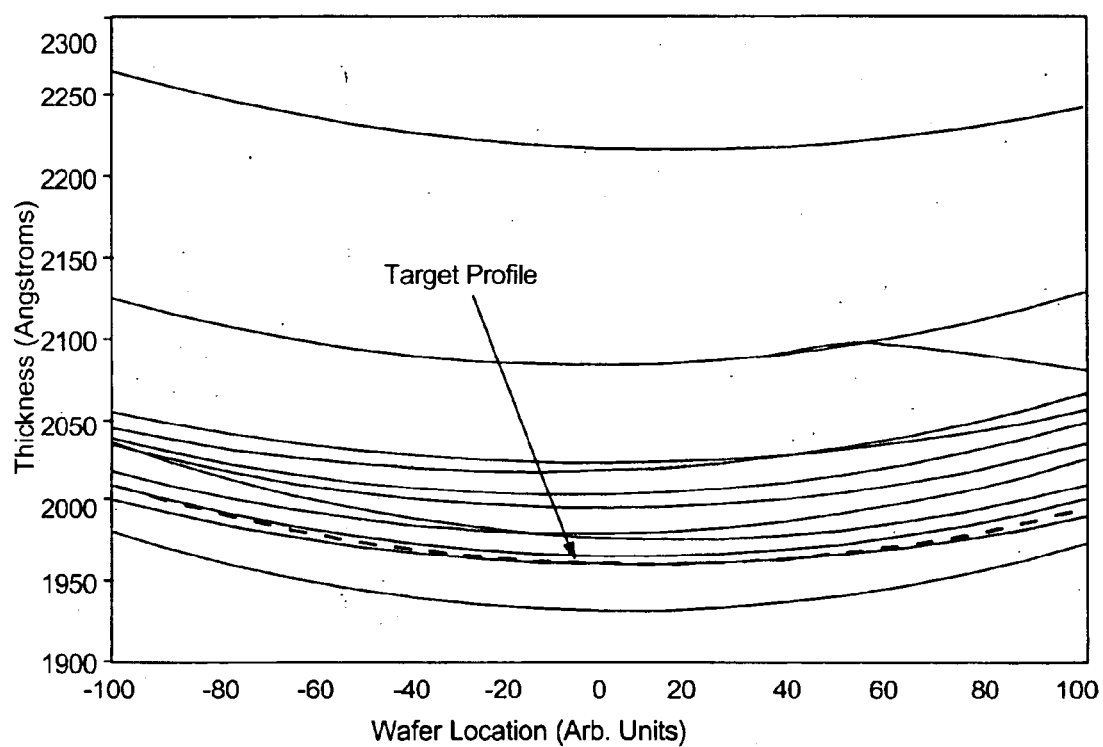
FIG. 2 is a graph showing the variability of film profiles for many wafers produced with the same integrated circuit manufacturing process compared to a target profile.
Figure 3A:
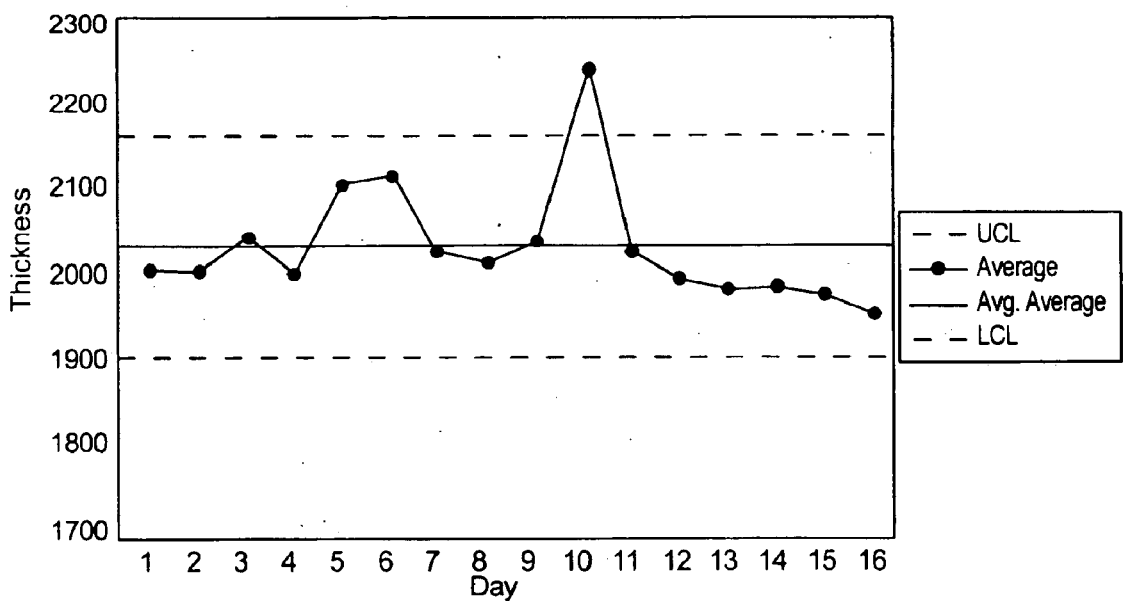
FIGS. 3(a) and 3(b) are plots of average film thickness and 3-Sigma standard deviation, respectively, for the same films in FIG. 2.
Figure 3B:
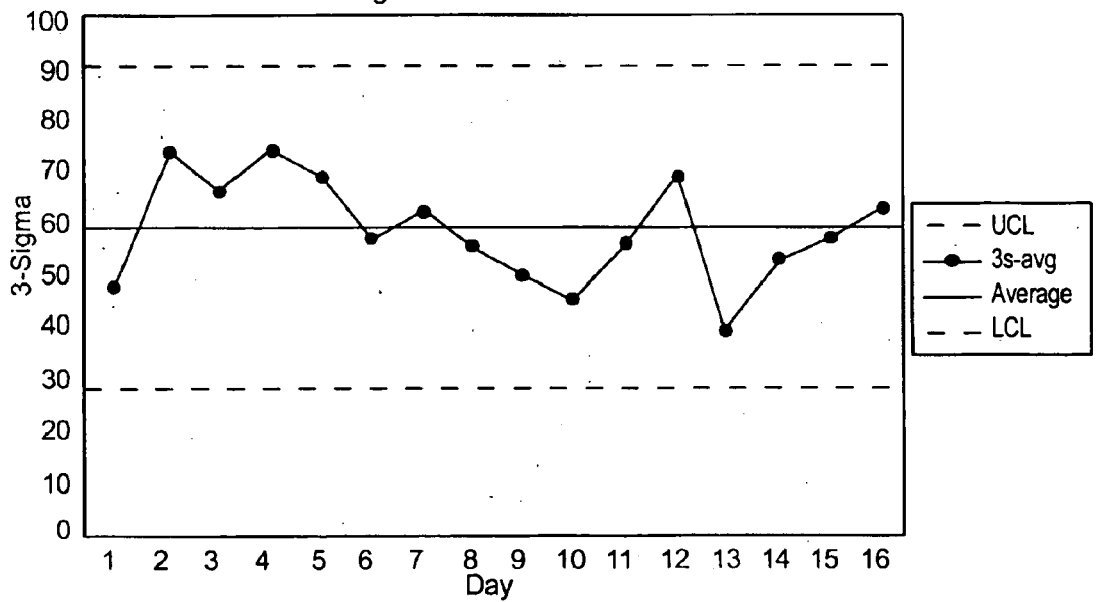

FIG. 2 shows the normal variation in across wafer polysilicon film thickness for a given LPCVD reactor over a period of time. Using conventional 3-Sigma process controls based on random variation about the target thickness, the statistical process control charts shown in FIGS. 3(a) and 3(b) have been prepared. FIGS. 3(a) and 3(b) are the statistical process control charts for thickness (FIG. 3(a)) and standard deviation (FIG. 3(b)) (3-sigma) relative to a nominal target thickness. The unbroken linear centerline represents the calculated average (which should be the desired thickness and/or variation) while the connected dots each represent a daily average film thickness for each given day (FIG. 3(a)) or the daily three-sigma thickness (FIG. 3(b)). The upper and lower dashed lines represent the upper and lower control limits (UCL, LCL). The upper and lower control limits in FIGS. 3(a) and 3(b) are based on 3-sigma statistics and result in only one of the thickness monitor wafers (day 10) being statistically different.

Figure 4A:
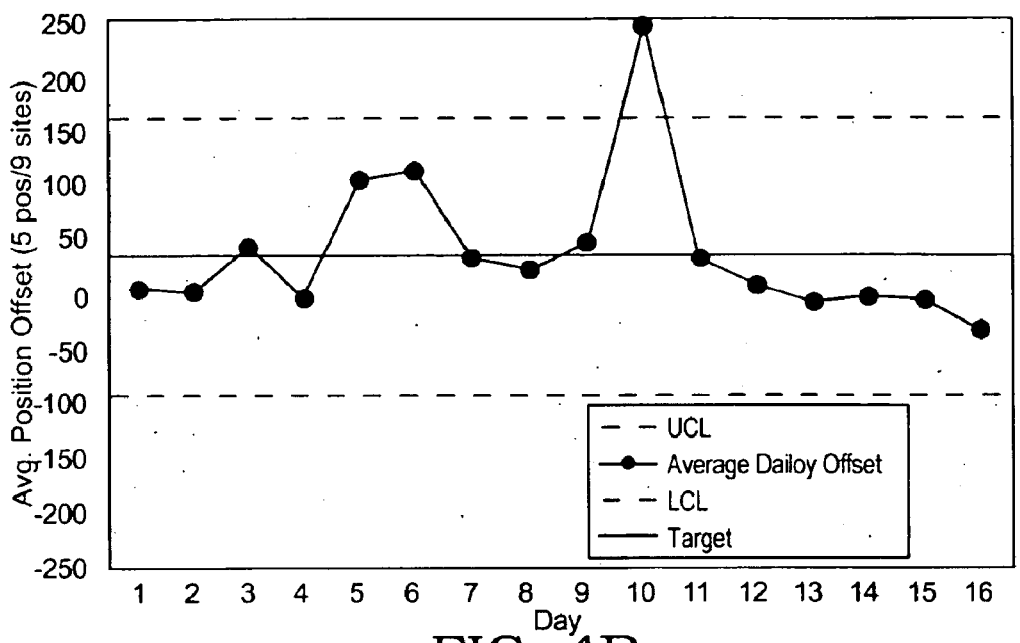
FIGS. 4(a) and 4(b) are plots of average thickness delta and 3-Sigma standard deviation of deltas, respectively, for the same films in FIG. 2 as compared to a target profile.
Figure 4B:
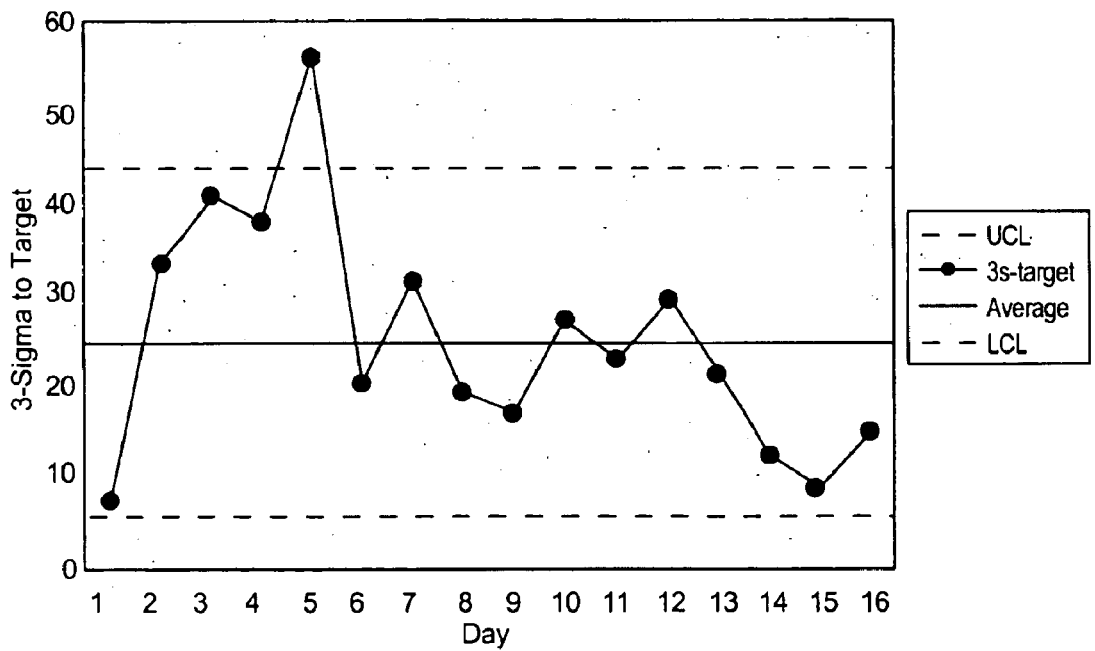

FIGS. 4(a) and 4(b) illustrate the delta-to-target 3-sigma control charts for (a) thickness, and (b) within wafer variation, as discussed in greater detail below.

The invention allows for a desired film profile to be the reference point. In FIG. 2, the target thickness profile is the average of all profiles. The statistical control charts can be recalculated if these are the desired profiles. To describe this procedure further, the measurement positions are in the following table.

TABLE 1

| Site | Location (x,y) is millimeters |
|------|-------------------------------|
| 1 | 0, 0 |
| 2 | 50, 0 |
| 3 | 0, 50 |
| 4 | 100, 0 |
| 5 | 0, 100 |
| 6 | −50, 0 |
| 7 | 0, −50 |
| 8 | −100, 0 |
| 9 | 0, −100 |

Figure 5B:
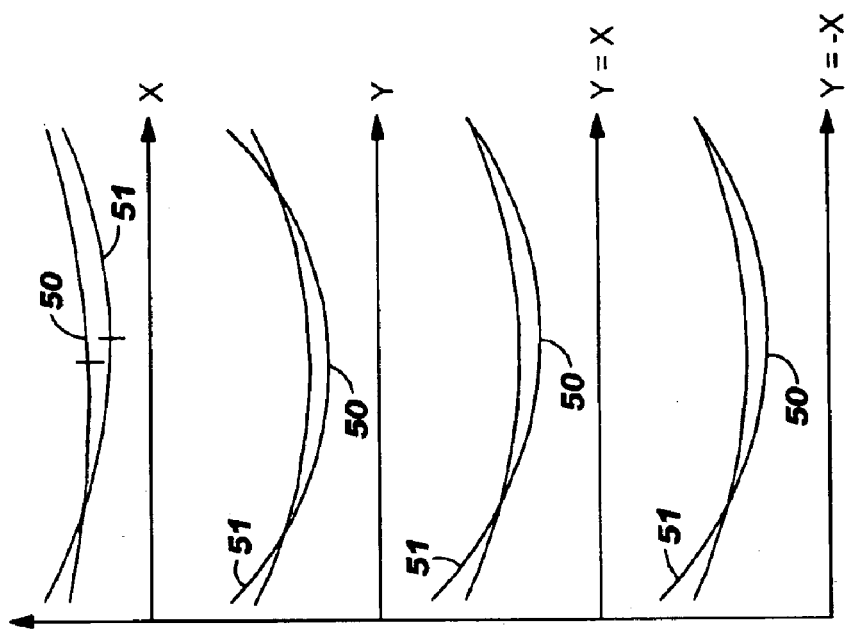
FIG. 5(b) illustrates a number of graphs that compare the profiles taken from a subset of measurement points shown in FIG. 5(a) to a desired profile.
Figure 5A:
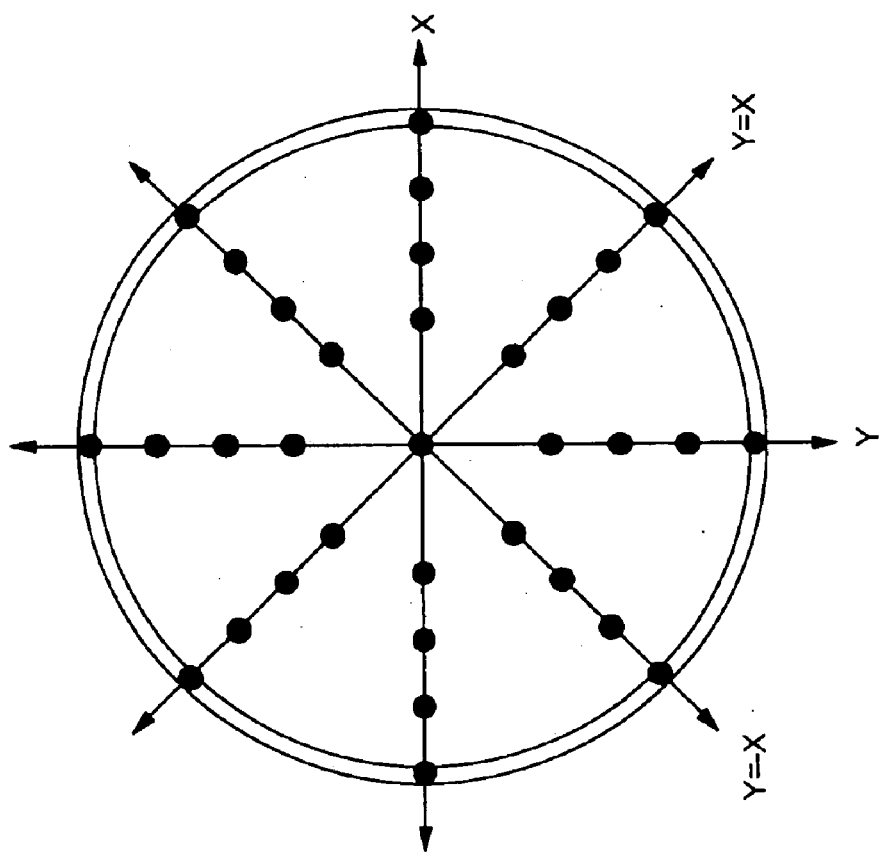
FIG. 5(a) is a top view of a film and different measurement points over the plane of the film.

The nine site scheme is illustrated in the top view in FIG. 5(a). More specifically, FIG. 5(a) illustrates two cross sectional measurements across sections of the film. These measurements occur along the X-axis and the Y-axis with the nine equally spaced measurement points along each axis. The invention can also include similar measurements between the X-axis and Y-axis, as shown in FIG. 5(a). FIG. 5(b) illustrates the curved function line extrapolated from the nine measurements which show the actual thickness profile 51 (contrasted to the desired thickness profile 50), for each of the four different cross-sections for an arbitrary sample. Based on the nine site scheme identified in Table 1, the thickness relative to target can be performed in numerous ways, such as a nine site contour—f(x,y); X-Axis only —f(x); Y-Axis only —f(y); or any combination of the above. For this aspect a combination of x and y variability is used which is consistent with a y=x 2D profile. The resulting control scheme utilizes five sites across the wafer.

In FIG. 2, a "target" profile is used to determine the radial symmetric profile that is expected. For each measurement site the actual measurement is subtracted from that of the target. In FIG. 3(a), the thickness control chart is upgraded to an average offset control chart FIG. 4(a). FIG. 4(b) shows the 3-sigma variation of the same data shown in FIG. 3(b) using the proposed sigma to offset. The average offset control chart has the same 3-sigma control limits as the standard thickness control chart. However, the chart is centered about zero rather than the physical thickness target. The added benefit of the new control scheme lies in the 3-sigma offset variation. The deviation is conventionally calculated as follows:

$$\ddot{\text{I}} = \hat{a} \cdots (t_i - t_{avg})^2/(n-1) \quad \text{Equation 5}$$

By migrating to a sigma to offset methodology the standard deviation becomes:

$$\ddot{\text{I}} = \hat{a} \cdots (t_i - t_{i,o})^2/(n-1) \quad \text{Equation 6}$$

where $t_{i,o}$ is the expected value for that particular site.

Figure 6:
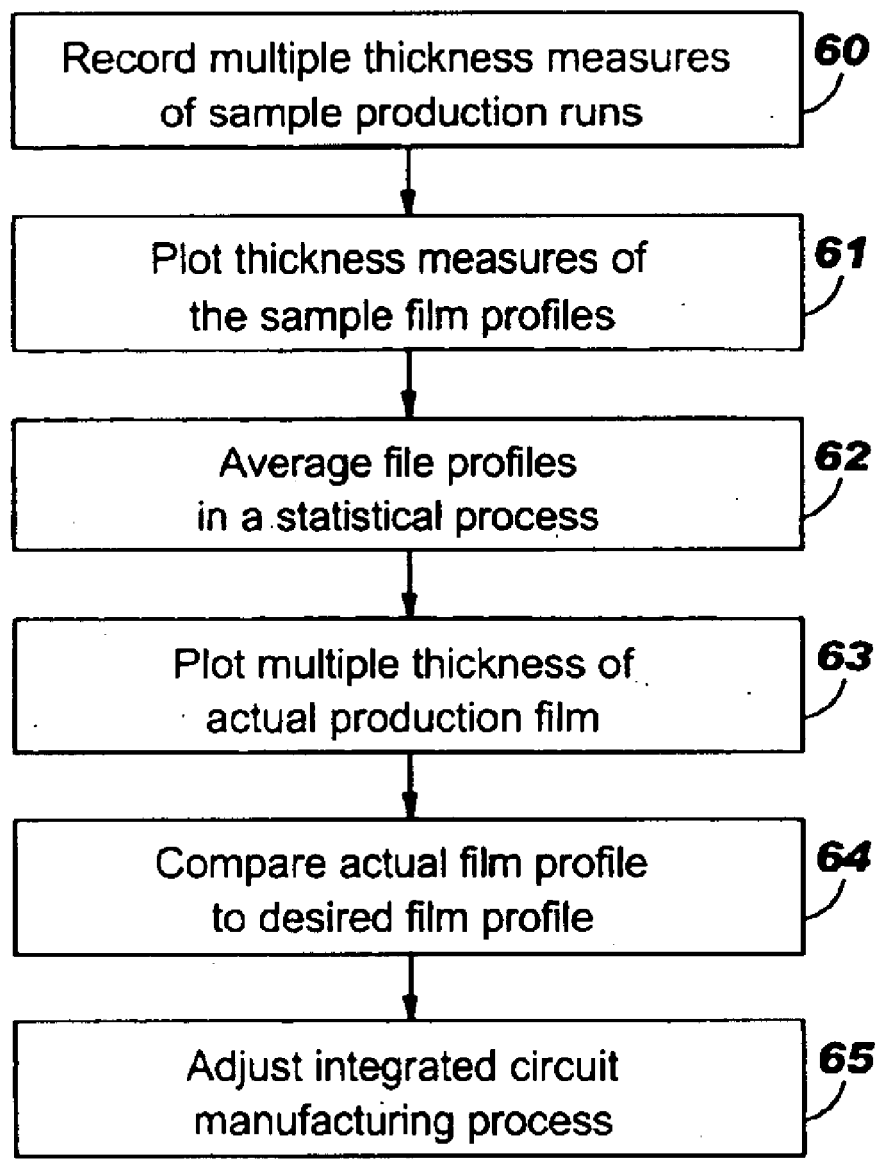
FIG. 6 is a flow diagram illustrating a preferred method of the invention.

As shown in the flowchart in FIG. 6, the invention, first establishes a "desired" profile of a given film in a prescribed manufacturing process by first recording multiple thickness measures taken at regular intervals along a number of lines crossing a plurality of different sample production runs of the same film formed in the integrated circuit manufacturing process 60. Next, the invention plots the thickness measures to produce sample film profiles of the film 61. These sample film profiles are averaged in a statistical process to produce the desired film profile 62.

After establishing the "desired" film profile, the desired film profile is compared to an actual production run. To perform this comparison, the invention first plots multiple thickness measures taken at regular intervals along at least one line crossing the actual production film formed in the integrated circuit manufacturing process 63. This produces an actual film profile of the film which is then compared to the desired film profile 64. If the actual film profile does not match the desired film profile, the integrated circuit manufacturing process used to make the film can then be adjusted to make the actual film profile match the desired film profile more closely 65.

Therefore, as shown above, the invention improves the control of film thicknesses within semiconductor manufacturing processes by evaluating an entire profile of a film layer (as opposed to an average of all points within the film layer). Therefore, the invention does more than just evaluate whether the average thickness of the film layer is within an acceptable range. To the contrary, the invention evaluates whether the entire "profile" (e.g., cross-section) of the film layer is within an acceptable thickness profile range. By evaluating the profiles of the films, the invention more accurately evaluates the real variability of the film layer in question. This in turn allows the film formation processing to be refined more precisely, thereby reducing process excursions substantially and increasing yield.

In the invention, semiconductor processing and control benefits ensure that target film thickness control is preserved with respect to prior art. The same measurement data from prior art can be used. The invention can be applied to metrology tools or fabricator control systems. The invention shows deviation from expected profiles and allows for control of serial processes to optimize yields. The invention also allows for feed-forward profile control. The invention can be applied to other geometric profiles (line, trough, contact, and via profiles). The invention can be used in other environments with any geometric profile controls (beams, rods, tubes, sheets, tapes, wires, etcâ•¦.).

While the invention has been described in terms of preferred embodiments, those skilled in the art will recognize that the invention can be practiced with modification within the spirit and scope of the appended claims.

What is claimed is:

1. A method of evaluating an integrated circuit manufacturing process, said method comprising:
   determining the actual film profile of a film formed in said integrated circuit manufacturing process by plotting multiple thickness measures across said film;
   comparing said actual film profile with a desired film profile; and
   if said actual film profile does not match said desired film profile, adjusting said integrated circuit manufacturing process to make said actual film profile match said desired film profile.

2. The method in claim 1, wherein said desired film profile comprises a range of acceptable film profiles.

3. The method in claim 1, wherein said actual film profile and said desired film profile comprise profiles across cross-sections of said film.

4. The method in claim 1, further comprising repeating said determining, comparing, and adjusting processes for different cross-sections of said film.

5. The method in claim 1, wherein said actual film profile and said desired film profile are irregular.

6. A method of evaluating an integrated circuit manufacturing process, said method comprising:
   determining the actual film profile of a film formed in said integrated circuit manufacturing process;
   determining a desired film profile by averaging previous formations of said film formed using the same integrated circuit manufacturing process;
   comparing said actual film profile with said desired film profile; and
   if said actual film profile does not match said desired film profile, adjusting said integrated circuit manufacturing process to make said actual film profile match said desired film profile.

7. A method of evaluating an integrated circuit manufacturing process, said method comprising:
   determining the actual film profile of a film formed in said integrated circuit manufacturing process;
   determining a desired film profile by averaging previous formations of said film formed using the same integrated circuit manufacturing process wherein said averaging process comprises a statistical analysis;
   comparing said actual film profile with said desired film profile; and
   if said actual film profile does not match said desired film profile, adjusting said integrated circuit manufacturing process to make said actual film profile match said desired film profile.

8. A method of evaluating an inflated circuit manufacturing process, said method comprising:
   plotting multiple thickness measures taken at regular intervals along a line crossing a film formed in said integrated circuit manufacturing process to produce an actual film profile of said film;
   comparing said actual film profile with a desired film profile; and
   if said actual film profile does not match said desired film profile, adjusting said integrated circuit manufacturing process to make said actual film profile match said desired film profile.

9. The method in claim 8, wherein said desired film profile comprises a range of acceptable film profiles.

10. The method in claim 8, wherein said actual film profile and said desired film profile comprise profiles across cross-sections of said film.

11. The method in claim 8, further comprising repeating said determining, comparing, and adjusting process for different cross-sections of said film.

12. The method in claim 8, further comprising determining said desired film profile by averaging previous formations of said film formed using the same integrated circuit manufacturing process.

13. The method in claim 12, wherein said averaging process comprises a statistical analysis.

14. The method in claim 8, wherein said actual film profile and said desired film profile are irregular.

15. A method of evaluating an integrated circuit manufacturing process, said method comprising:
   recording multiple thickness measures taken at regular intervals along a plurality of lines crossing a plurality of different sample production runs of the same film formed in said integrated circuit manufacturing process;
   plotting said thickness measures to produce a plurality of sample film profiles of said film;
   averaging said sample film profiles in a statistical process to produce a film profile;

plotting multiple thickness measures taken at regular intervals along at least one line crossing an actual production film formed in said integrated circuit manufacturing process to produce an actual film profile of said film;

comparing said actual film profile with said desired film profile; and if said actual film profile does not match said desired film profile, adjusting said integrated circuit manufacturing process to make said actual film profile match said desired film profile.

16. The method in claim 15, wherein said desired film profile comprises a range of acceptable film profiles.

17. The method in claim 15, wherein said actual film profile and said desired film profile comprise profiles across cross-sections of said film.

18. The method in claim 15, further comprising repeating said comparing and adjusting process for different cross sections of said film.

19. The method in claim 15, wherein said actual film profile and said desired film profile are irregular.

* * * * *